(12) United States Patent
Neidig

(10) Patent No.: US 7,030,426 B2
(45) Date of Patent: Apr. 18, 2006

(54) POWER SEMICONDUCTOR COMPONENT IN THE PLANAR TECHNIQUE

(75) Inventor: Arno Neidig, Plankstadt (DE)

(73) Assignee: IXYS Semiconductor GmbH, Lampertheim (DE)

( * ) Notice: Subject to any disclaimer, the term of this patent is extended or adjusted under 35 U.S.C. 154(b) by 0 days.

(21) Appl. No.: 11/079,440

(22) Filed: Mar. 14, 2005

(65) Prior Publication Data

US 2005/0212075 A1    Sep. 29, 2005

(30) Foreign Application Priority Data

Mar. 16, 2004 (DE) .............. 10 2004 012 884

(51) Int. Cl.
*H01L 29/68* (2006.01)
(52) U.S. Cl. ................... 257/170; 257/502
(58) Field of Classification Search ............. None
See application file for complete search history.

(56) References Cited

U.S. PATENT DOCUMENTS

| | | | |
|---|---|---|---|
| 4,137,123 A | 1/1979 | Bailey et al. | 156/647 |
| 4,468,686 A | 8/1984 | Rosenthal | 357/53 |
| 4,680,615 A | 7/1987 | Gotzenbrucker et al. | 357/55 |
| 4,927,772 A | 5/1990 | Arthur et al. | 437/6 |
| 5,605,852 A * | 2/1997 | Bencuya | 438/270 |
| 5,714,396 A | 2/1998 | Robb et al. | 437/31 |
| 6,147,297 A | 11/2000 | Wettling et al. | 136/256 |
| 6,455,911 B1 | 9/2002 | Stephani et al. | 257/493 |
| 6,583,487 B1 * | 6/2003 | Roy | 257/496 |
| 6,607,972 B1 | 8/2003 | Schulze et al. | 438/510 |
| 2003/0119332 A1 | 6/2003 | Kuebelbeck et al. | 438/753 |

FOREIGN PATENT DOCUMENTS

| | | |
|---|---|---|
| DE | 34 22 051 A1 | 12/1985 |
| DE | 3832709 A * | 3/1990 |
| DE | 195 22 539 | 1/1997 |
| DE | 195 31 369 | 2/1997 |
| DE | 199 33 985 | 2/2001 |
| DE | 199 42 679 | 4/2001 |
| DE | 199 62 136 | 6/2001 |
| DE | 100 51 909 A1 | 5/2002 |
| EP | 0361 318 A2 | 9/1989 |

OTHER PUBLICATIONS

"A New Junction Termination Method Employing Shallow Trenches Filled With Oxide", IEEE Electron Device Letters, vol. 25, No. 1, Jan. 2004.

* cited by examiner

*Primary Examiner*—Tu-Tu Ho
(74) *Attorney, Agent, or Firm*—Heslin Rothenberg Farley & Mesiti P.C.

(57) ABSTRACT

In a power semiconductor component produced in a planar technique, a near-surface structure having at least one depression is formed in a surface region of an edge termination adjacent a main surface of the semiconductor body. The structure lies inside a space charge region formed when a voltage is applied at a junction between semiconductor regions of opposite conduction type. Dielectric material may fill the depression and form a passivation layer on the surface region. The depression may be an annular trench having a width to depth ratio $\leq 1$. Alternatively, the structure may be waffle-shaped with multiple depressions.

11 Claims, 4 Drawing Sheets

POWER SEMICONDUCTOR COMPONENT IN THE PLANAR TECHNIQUE

BACKGROUND OF THE INVENTION

1. Technical Field

The present invention relates to a power semiconductor component produced in the planar technique with a semiconductor body of the one conduction type, in whose surface region adjacent to a main surface there is embedded at least one semiconductor region of another conduction type opposite to the one conduction type.

2. Background Information

Power semiconductor components are characterised by a high electric strength. Examples of such semiconductor components are thyristors or diodes. In order to achieve a high maximum blocking voltage, the design of the edge termination of a semiconductor component is of particular importance. An essential problem of the edge termination lies in controlling the electric field strength in such a way that a premature breakdown is avoided in the case of blocking. In order to achieve this, the equipotential lines in the area of the chip edge have to be led in the case of blocking in a defined manner from the interior of the component to its surface. A further problem of the edge termination is the shielding of the chip edge against electric charges and chemical influences, which can cause local increases in field strength and a reduction in the maximum blocking voltage or parasitic blocking currents. Various designs of edge terminations are described for example in J. Baliga "Modern Power Devices", John Wiley & Sons, 1987, pages 93–131.

In the case of high-power semiconductor components, which however are not produced in the planar technique, it is known to structure the chip edge by mechanical machining in order to achieve an extension of the space charge region, which reduces the electric surface field. Mechanical machining does not however come into question for power semiconductor components produced in the planar technique, since all the process steps up to the division into individual chips have to take place on the wafer. The etching technique described in DE 34 22 051 A1, for laying open to public inspection the pn-junction, is also eliminated in the case of semiconductor components in the planar technique.

Field-limiting rings, which are also referred to as guard rings, as well as so-called channel stoppers are used to increase the maximum blocking voltage of power semiconductor components.

EP 0 361 318 A2 describes a planar thyristor with several guard rings and a channel stopper. Guard rings and channel stoppers lie within the region of the semiconductor body, which is surrounded by a zone produced by insulation diffusion.

The guard rings can effectively reduce the surface field, but they do not offer any solution against the effect of surface charges, since the low-doped regions lying between the guard rings react very sensitively to freely mobile surface charges and polarisable molecules, and this can lead to an inversion of the surface and thus to a conductive connection between the guard rings. When relatively high voltages are applied and a relatively deep inversion layer is formed, the channel stopper is unable to prevent the formation of a channel and parasitic leakage currents, if the inversion layer extends up to right next to the channel stopper and high field strengths are created there, which can lead to the injection of charge carriers into the space charge region.

A similar function to the guard rings is possessed by so-called "junction termination extensions" (JTE), such as are described for example in U.S. Pat. No. 4,927,772 or DE 195 31 369. But the junction termination extensions also have the same drawbacks as the guard rings.

It is also known to combine the guard rings and JTE structures with so-called magnetoresistors, in order to suppress for the most part the influence of surface charges. These are described for example in U.S. Pat. No. 4,468,686, U.S. Pat. No. 5,714,396, DE 199 33 985 and DE 199 42 679. There is generally deposited over the magnetoresistors a layer of a resistant, adhesive plastic, such as for example polyimide, in order to avoid electrical spark-overs on account of the short distance of the field rings due to space reasons.

DE 100 51 909 A1 describes an edge termination for a power semiconductor component, wherein the location of the curvature and compression of the equipotential lines is placed into a vertically running insulator region. The breakdown field strength of the insulator forming the insulator region has a much higher value than the semiconductor material forming the semiconductor body. This higher breakdown field strength is intended to permit greater curvatures and compressions of the equipotential lines, as a result of which a considerable reduction in the surface requirement can be achieved. A decisive factor is that the semiconductor chip is deeply notched in the edge region. The notch extends virtually over the whole depth of the space charge region, which is formed in the presence of the maximum applied blocking voltage between the semiconductor regions of opposite conduction type. The relatively costly production of the vertical edge termination is a drawback. Moreover, the chip is weakened at the edge, which is a drawback especially during the handling and division of the wafer into individual chips.

Surface structures designed in the manner of a waffle for solar cells are known from U.S. Pat. No. 4,137,123. The waffle-shaped structures are intended to reduce reflections at the solar cells.

The problem underlying the invention is to provide a power semiconductor component capable of being produced relatively simply in the planar technique, with which both the formation of harmful field peaks in the edge termination are avoided and the effect of surface charges is reduced.

SUMMARY OF THE INVENTION

With the power semiconductor component produced according to the invention in the planar technique, a near-surface structure, which has at least one depression, is formed in the surface region of the edge termination adjacent to the main surface. This structure is hereinafter referred to as the near-surface structure or simply the surface structure. The surface structure is formed in such a way that it lies completely inside the space charge region, which is formed when a voltage is applied at the junction between the semiconductor regions of opposite conduction type. The surface structure should extend into the depth of the semiconductor body solely over a fraction of the space charge region. The structure thus differs from the vertical notch into the semiconductor body described by DE 100 51 909 A1. To advantage, the surface structure according to the invention is used in combination with field or guard rings, such as are used with high-blocking planar power components. The surface structure according to the invention does not in fact need to be positioned with the same accuracy relative to the pn junction as the field rings.

The invention is based on the knowledge that the parasitic blocking current, in the presence of an inversion layer (channel) produced by surface charges, essentially depends on the electrical resistance of this layer. The electrical surface resistance is increased with the surface structure according to the invention, as a result of which the effect of the surface charges is diminished and harmful field peaks are avoided.

In a preferred form of embodiment of the power semiconductor component, the at least one depression of the surface structure is filled with a dielectric material. A passivation layer of dielectric material covering the surface structure is preferably deposited on the main surface of the semiconductor body in the region of the edge termination.

The surface structure can in principle be differently constituted. In a preferred form of embodiment, the at least one depression of the surface structure is designed as an annular trench. It has been shown that the maximum blocking voltage can be particularly effectively increased when the ratio between the width and depth of the trenches is equal to or preferably less than 1. Trenches with a depth that is less than 15 µm and with a width that is smaller than their depth have proved to be particularly advantageous in practice.

The trenches can be produced without great expense during the production process of the semiconductor component. The process steps required for this, e.g. chemical etching or plasma-assisted dry etching, are known to the expert.

With a crystal orientation in the (100) direction of the semiconductor body, a surface structure designed in the manner of a waffle with a plurality of depressions has proved to be particularly advantageous. Surfaces folded in the manner of a waffle are known as such in solar cells for the reduction of reflections. Attention is drawn in this regard to U.S. Pat. No. 4,137,123, the entire contents of which is incorporated herein by reference.

In the case of power semiconductor components which have a channel stopper in the region of the edge termination, the surface structure is preferably arranged between the channel stopper and the surface region into which the at least one semiconductor region of the other conduction type is embedded.

In the case of semiconductor components that are terminated in the edge region with a zone produced by insulation diffusion, the surface structure is preferably arranged between the surface region into which the at least one semiconductor region of the other conduction type is embedded and the zone produced by insulation diffusion. If, in the region of the edge termination, field-limiting rings are also provided, the surface structure is preferably arranged between the field-limiting rings and the zone produced by insulation diffusion. Further depressions can also be provided between the field-limiting rings for the convolution of the surface.

BRIEF DESCRIPTION OF THE DRAWINGS

The invention will be explained in greater detail below with the aid of the examples of embodiment represented in the drawings.

The figures show the following.

DETAILED DESCRIPTION OF THE INVENTION

Figure 1:
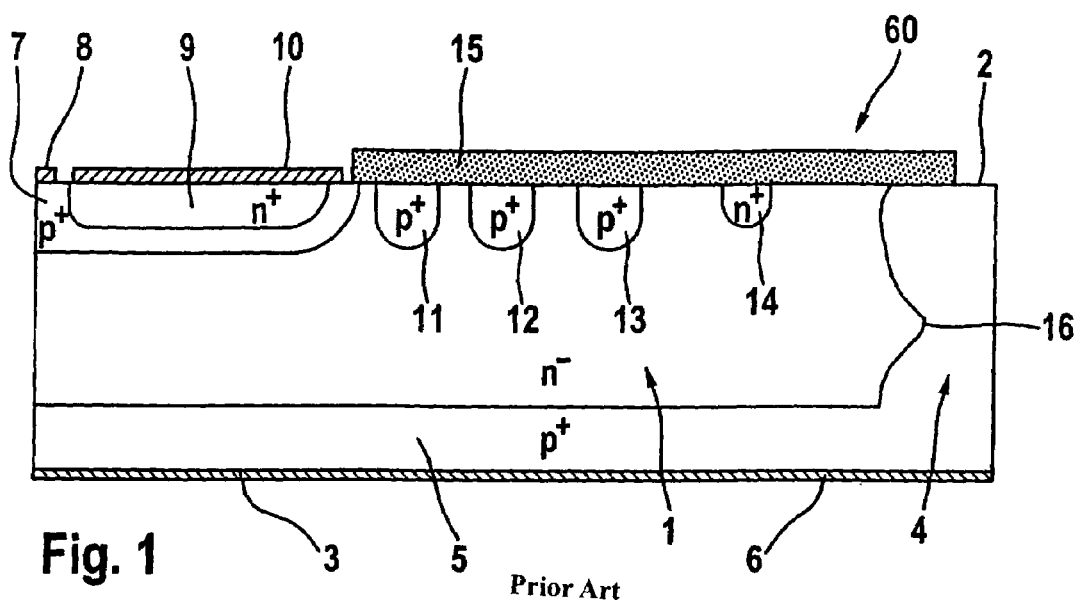
FIG. 1 a thyristor as a power semiconductor component in cross-section according to the prior art, which has field-limiting rings and a channel stopper, FIG. 2 a blocking-state characteristic of the thyristor from FIG. 1, when a channel has not yet been formed, FIG. 3 blocking-state characteristics of a thyristor from FIG. 1, which does not have a channel stopper, FIG. 4 blocking-state characteristics of a thyristor from FIG. 1 with a channel stopper, when a channel has been formed, FIG. 5 a diagrammatic representation of the space charge region of the thyristor from FIG. 1 in the case of a relatively small inversion, FIG. 6 a space charge region of the thyristor from FIG. 1 in the case of a relatively great inversion, FIG. 7 the semiconductor component according to the invention in cross-section, FIG. 8 the semiconductor component from FIG. 7 according to the invention in plan view, FIG. 9 a diagrammatic representation of the surface charges and the field-line pattern in the region of a trench with the semiconductor component from FIG. 7 according to the invention, FIG. 10 a diagrammatic representation of the surface charges and the field-line pattern with an alternative form of embodiment of the semiconductor component according to the invention, wherein the surface structure is designed in the manner of a waffle, FIG. 11 a simplified perspective representation of the waffle structure from FIG. 10 and FIG. 12 a power diode in cross-section with the surface structure according to invention in the region of the edge termination.

FIG. 1 shows a thyristor in cross-section produced according to the prior art in the planar technique. An $n^-$-conductive silicon disc ((111)-Si), as semiconductor body 1, is used to produce the thyristor, said silicon disc having an upper main surface 2 and a lower main surface 3. The demarcation of the individual thyristors in the silicon disc 1 takes place with a $p^+$-insulation diffusion from upper and lower main surface 2, 3, as a result of which a $p^+$-conductive component edge 4 arises. With a further diffusion, a $p^+$-conductive zone 5 is produced in the surface region adjacent to lower main surface 3. A pn-junction 16 arises, which extends in the edge region up to upper main surface 2. A full-surface anode metallic coating 6 is deposited on lower main surface 3.

A $p^+$-conductive base layer 7 with a metallic coating 8 for the gate terminal is located in a first surface region adjacent to upper main surface 2. An $n^+$-conductive zone 9 with a metallic coating 10 for the cathode terminal lies in $p^+$-conductive zone 7. Between $p^+$-conductive zone 7 and $p^+$-conductive component edge 4 lie three field-limiting rings (guard rings) 11, 12, 13 arranged at a distance from one another, which are produced by an edge diffusion process at the same time as the surface region of zone 7 adjacent to main surface 2. Arranged between guard rings 11, 12, 13 and $p^+$-conductive component edge 4 is a so-called channel stopper 14, which is produced in a phosphorus diffusion process, as a rule together with zone 9. The edge termination of the thyristor is designated by reference number 60.

A glass passivation 15 is deposited on the semiconductor substrate in the region of upper main surface 2 between $p^+$-conductive inner zone 7 and $p^+$-conductive edge zone 4 and partially overlapping the latter.

Figure 2:
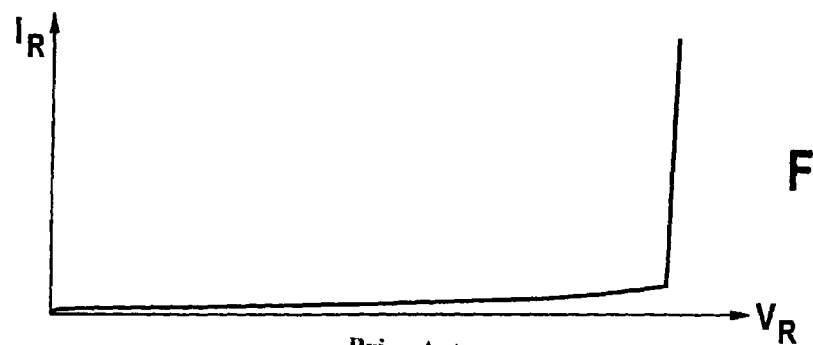

FIG. 2 shows a blocking-state characteristic of the thyristor from FIG. 1, whereby an inversion layer (channel) produced by surface charges has not yet been formed at upper main surface 2.

Figure 3:
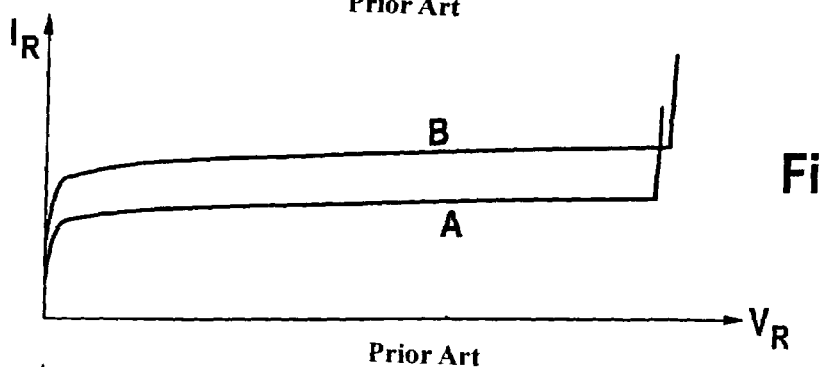

FIG. 3 shows blocking-state characteristics of a thyristor from FIG. 1, which however does not have a channel stopper, when surface charges are present and an inversion layer (channel) with inversion increasing from A to B has been formed. The consequence is increased blocking-state losses and instabilities of the blocking properties.

A channel stopper can hinder the occurrence of so-called starting currents in the blocking-state characteristics $I_R$ against $U_R$, but a degradation of the blocking-state characteristic appears, which however only occurs at higher voltages when, in the presence of a high surface charge, an inversion layer runs hard against the n$^+$-zone of the channel stopper. High gradients of the charge carrier concentration are then present there, which ultimately lead to the injection of charge carriers into the space charge region.

Figure 4:
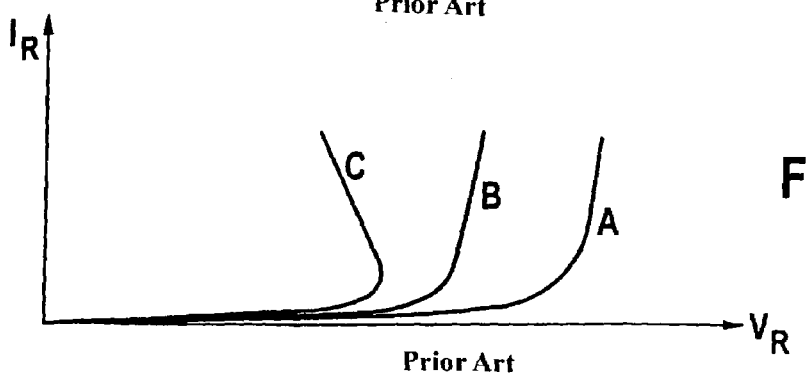
Figure 5:
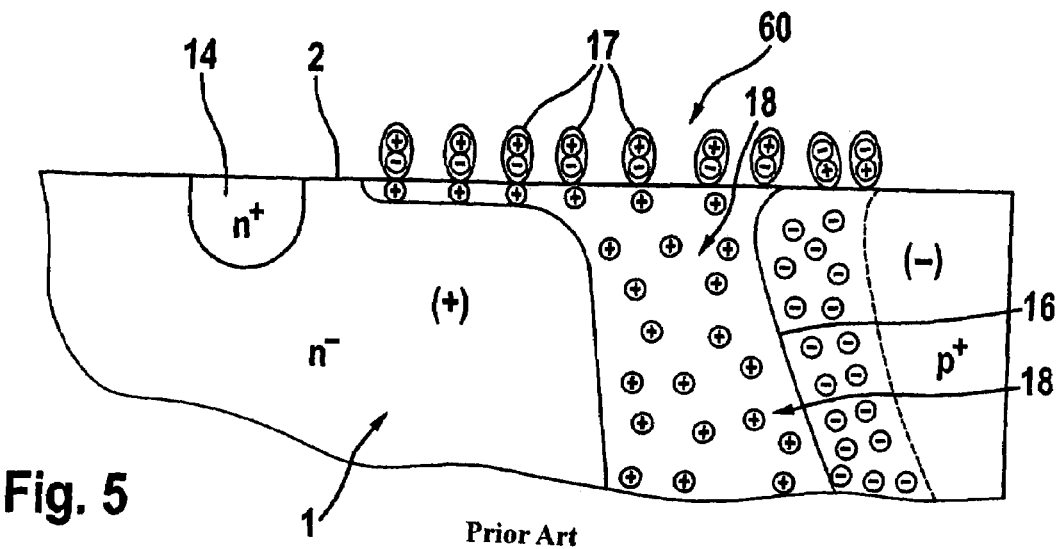
Figure 6:
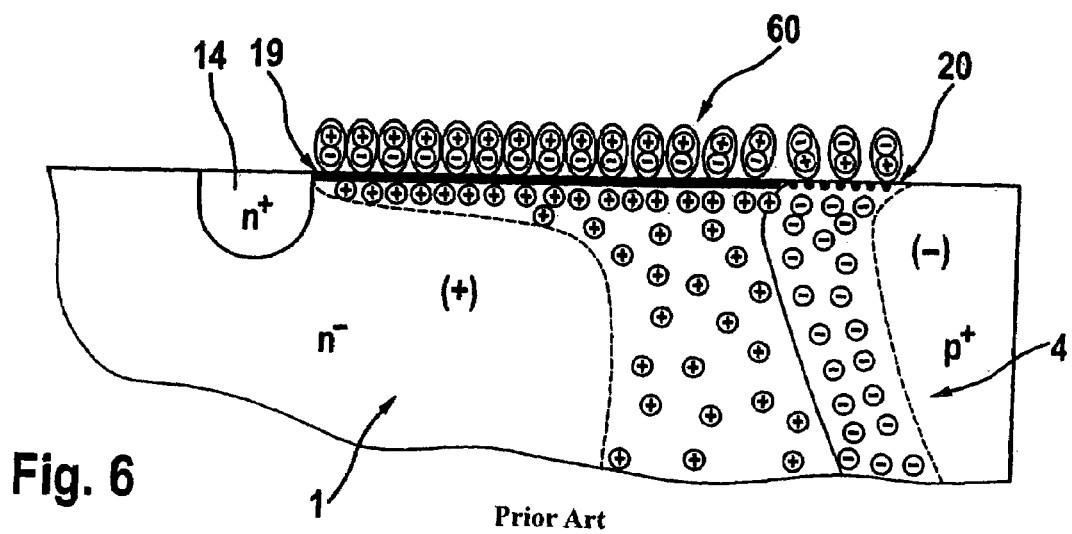

FIG. 4 shows blocking-state characteristics of the thyristor from FIG. 1, which has a channel stopper, when surface charges are present and an inversion layer (channel) has been formed with inversion increasing from A to C. The consequence is that the specific maximum blocking voltage is not reached. This can even lead to the loss of the blocking ability. FIGS. 5 and 6 are intended to illustrate the formation of space charge region 18 in the region of the edge termination of the thyristor from FIG. 1, whereby the representation of the glass passivation layer has been omitted for reasons of greater clarity. The zones corresponding to one another are provided with the same reference numbers. Surface charges 17 are indicated as mobile dipole molecules, such as are usually encountered in the casting compounds of encapsulated power semiconductor components. The concentration of the charges is not yet sufficient to invert the surface. The space charge region in the area of pn-junction 16 extends from upper main surface 2 deep into n$^-$-conductive zone 1. The resultant breakdown voltage roughly corresponds to the volume breakdown voltage, since the space charge region at the surface is extended. The blocking-state characteristic corresponds to the characteristics of FIG. 2.

FIG. 6 shows the formation of the space charge region of the thyristor from FIG. 1 in the case of a relatively great inversion with polarisation present. In this case, a near-surface p-inversion layer 19 is formed in n$^-$-conductive zone 1 in the region of upper main surface 2 outside channel stopper 14 and a near-surface n-inversion layer 20 is formed in p$^+$-conductive edge zone 4. There thus arises a sequence of the n$^+$-zone of channel stopper 14, p-inversion layer 19, n-inversion layer 20 and finally p$^+$-edge zone 4. The sequence of the zones is comparable with a pnpn layer sequence of a Shockley diode. It involves here a near-surface (lateral) pnpn-structure.

A parasitic surface current flows on account of the pnpn layer sequence, whereby the junctions between the two n- and p-inversion regions 19, 20 for the on-state and the two outer junctions in the blocking direction are polarised. In such a case, the pnpn layer sequence of a Shockley diode would be blocking. Since, however, the outer junctions do not possess a high blocking ability on account of the steep charge-carrier gradients, an escalating amplification mechanism occurs here. The blocking-state characteristics thus display, with increasing inversion, a course which transforms from A to B (FIG. 4), whilst more and more charge carriers are injected into the space charge region. With increasing inversion, a filament-like current flow then occurs, which leads to the appearance of an arc channel and finally to the destructive short-circuit (FIG. 4: characteristic C).

Figure 7:
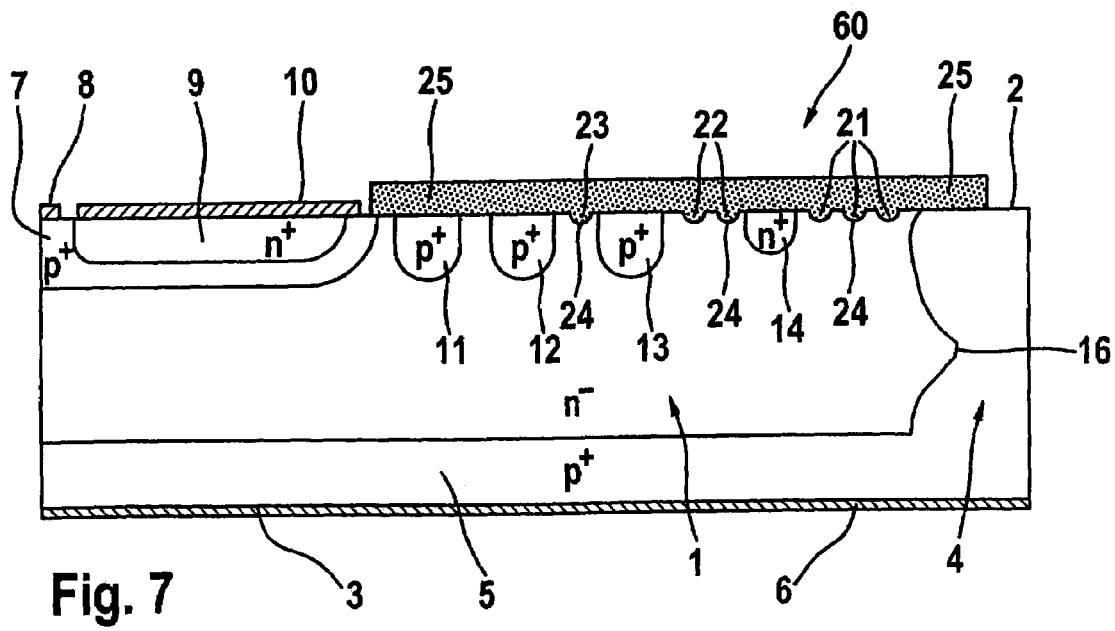

FIG. 7 shows the thyristor according to the invention, which has the surface structure according to the invention. Trenches 21 and 22 are formed respectively in the surface region adjacent to main surface 2 between channel stopper 14 and p$^+$-conductive edge zone 4 and between guard rings 11, 12, 13 and channel stopper 14. They thus lie inside space charge region 18 shown in FIGS. 5 and 6, which is formed when a voltage is applied at the junction between the semiconductor regions of opposite conduction type. A further trench 23 is located between guard rings 12 and 13. The trenches are etched into the semiconductor body. They preferably have a depth and width which lies between 4 µm to 6 µm. The dimensions of the trenches can be adapted to the standard mask technique. The number can be selected arbitrarily large depending on the blocking voltage rating of the semiconductor body.

One or more dielectric layers 24, of passivation glass for example, are introduced into the trenches. Passivation glass 25 also covers upper main surface 2 of the semiconductor body between inner p$^+$-conductive zone 7 and p$^+$-conductive edge zone 4.

Trenches 21 and 22 ensure that a substantial part of the electric voltage diminishes over the surface regions in which trenches are arranged. Since the drop in voltage at the junctions from the outer doped zones to the adjacent inversion layers thus proves to be relatively small, the amplification mechanism described above no longer occurs.

Figure 8:
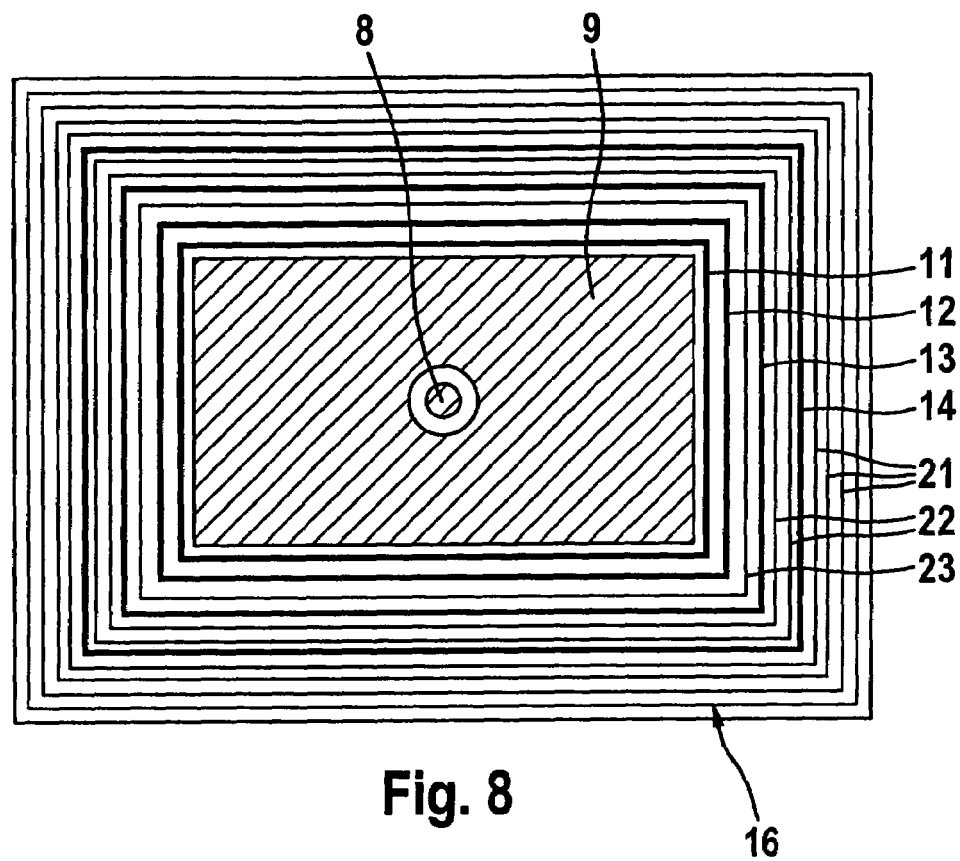

FIG. 8 shows the thyristor with the annular trenches in plan view, whereby the rounded-off corners are not shown in order to simplify the representation.

Figure 9:
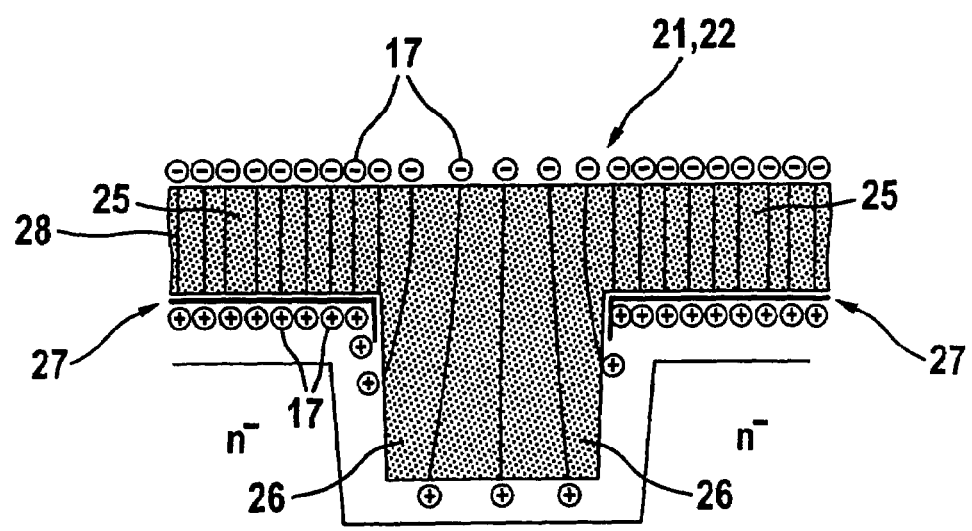

FIG. 9 illustrates surface charges 17 and field-line pattern 28 in the region of an annular trench 21, 22. The regions of higher surface conductivity lying outside the trench are designated by reference number 25 and the region of low surface conductivity lying inside the trench by 26. The inversion is small or not present inside the trench, whereas an inversion channel 27 is formed outside the trench.

It has been shown that the smaller the ratio of depth to width, the better the effect of the trenches. An attempt is therefore made to provide trenches that are as narrow as possible, which are preferably produced by reactive ion etching (or RIE). The path resistance at the surface between cathode and anode of the power semiconductor component is all the greater, the more the trenches introduced. A plurality of trenches also has the advantage that any bridges that may be present are of less importance, as a result of which the created edge termination is relatively insensitive to mask faults.

It is advantageous that, in order to produce the trenches, only one additional masking and etching step is required before the passivation with glass. The use of the surface structure according to the invention is not restricted to bipolar power semiconductor components. The surface structure can also be used to advantage with IGBT's and power MOSFET's, which are produced with or without a diffusion technique.

Instead of a plurality of annular trenches, however, a surface structure designed in the manner of a waffle can also be provided with a plurality of depressions. The design and production of the waffle-shaped surface structure is described in detail in U.S. Pat. No. 4,137,123 incorporated herein, in its entirety, by reference. It is distinguished by a plurality of depressions, which are bounded by triangular faces. The waffle-shaped surface structure is also described in DE 195 22 539 and DE 199 62 136, to which express reference is also made.

The waffle-shaped surface structure is used to advantage in semiconductor bodies with a crystal orientation in the (100) direction, which are used for example in IGBT and MOSFET power semiconductor components. The regions on the semiconductor chip on which the waffle-shaped surface structure is provided correspond to the regions in which the annular trenches described by reference to FIGS. 7 to 9 are arranged.

Figure 10:
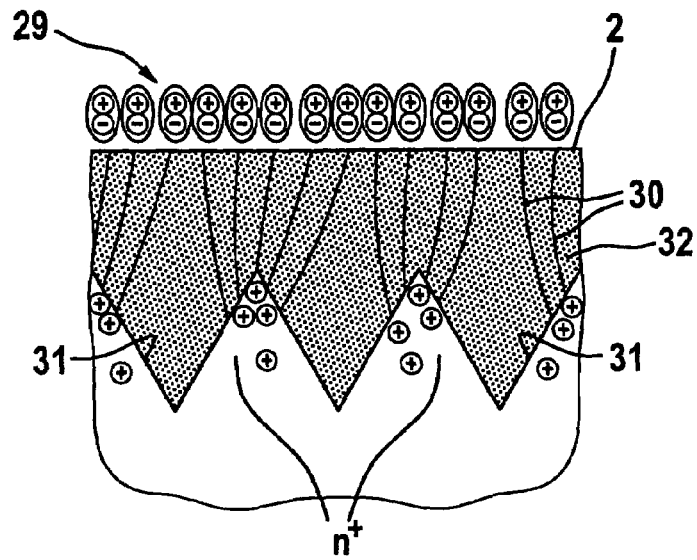

FIG. 10 shows the waffle-shaped surface structure with polarised dipole molecules 29 and field-line pattern 30 in cross-section immediately after switching off the voltage applied at the pn junction in the blocking direction, after which a polarisation has formed. Depressions 31 are filled with passivation glass 32, which is also deposited as a layer onto upper main surface 2 of the semiconductor body. FIG. 10 shows that the polarised state is still "frozen-in".

Figure 11:
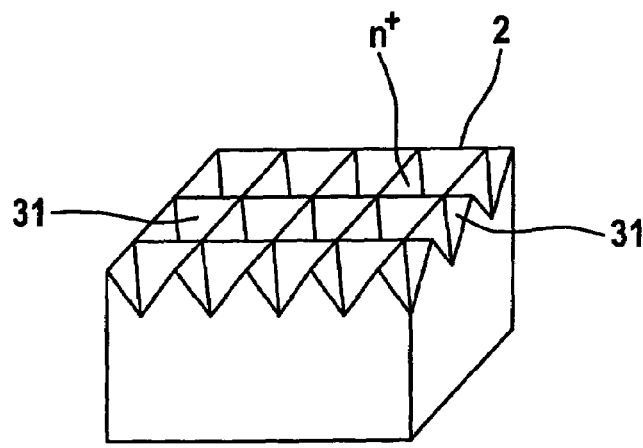

FIG. 11 shows the structured surface in a simplified perspective representation. The surface structure can be produced by orientation-dependent, structured etching. A method for the production of a regular pyramid structure by means of masked etching is described for example in DE 195 22 539. U.S. Pat. No. 4,137,123 describes a method for the production of an irregular pyramid structure, which can also be provided.

Higher doping at the surface of the semiconductor body in the region of the pyramid structure has proved to be advantageous. An inversion at the peaks of the pyramids is thus avoided. The regions of higher doping ($n^+$) are identified in FIGS. 10 and 11. When calculating the $n^+$ doping, however, care must be taken to ensure that only as many donors are added at the peaks of the pyramids as are removed in the depressions, in order not to hinder the space charge region in its overall extension.

Higher doping at the peaks of the pyramids can be achieved, for example, by designing the region of the channel stopper wider and then carrying out the structural etching in this wider $n^+$ zone. The combination with higher $n^+$ doping at the surface of the pyramid structure is not restricted to the structural etching of the (100) crystals. It can also be employed to advantage in a semiconductor body with a crystal orientation in the (111) direction between the annular trenches described by reference to FIGS. 7 to 9.

Figure 12:
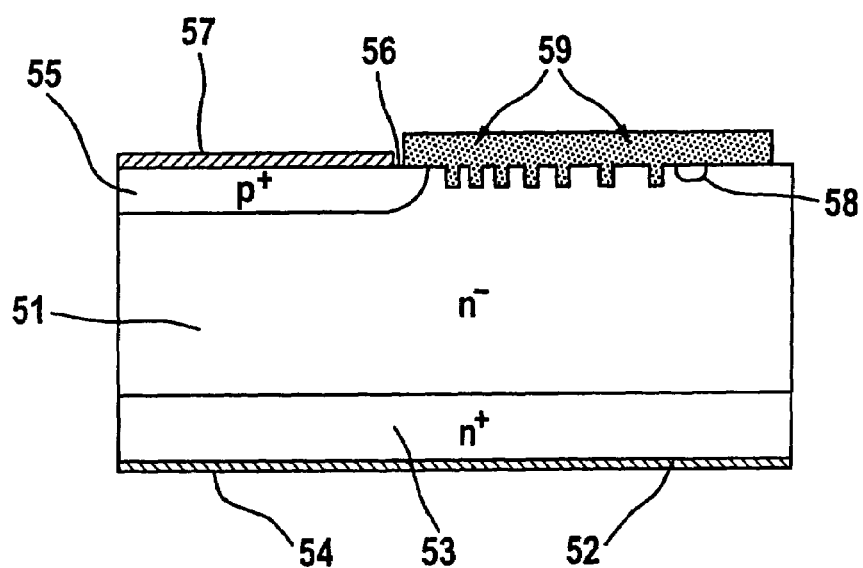

FIG. 12 shows in cross-section a power diode produced in the planar technique. $n^-$-doped semiconductor body 51 has, adjacent to lower main surface 52, an $n^+$-doped zone 53 onto which a cathode metallic coating 54 is deposited. An inner $p^+$-doped zone 55 is located in the surface region adjacent to upper main surface 56. An anode metallic coating 57 is deposited on $p^+$-doped zone 55. The edge zone of the semiconductor body is terminated by a channel stopper 58. Near-surface annular trenches 59, which are described by reference to FIGS. 7 to 9, lie between inner $p^+$-doped zone 55 and channel stopper 58.

The power diode does not have field-limiting rings (guard rings). Instead of the guard rings, near-surface trenches 59 are arranged staggered. The distance between each two neighbouring trenches increases continuously from inner $p^+$-doped zone 55 outwards up to channel stopper 58. In this case, the mask technique for production requires a higher precision in respect of zone 55. By means of a staggered arrangement of trenches known to the expert—similar to the case of field rings, it is possible to achieve a situation where the maximum achievable blocking voltage is better utilised and instabilities are avoided.

The invention claimed is:

1. A power semiconductor component produced in the planar technique comprising: a semiconductor body of one conduction type, at least one semiconductor region of another conduction type opposite to the one conduction type embedded in a first surface region adjacent to a main surface of the semiconductor body, an edge termination terminating the semiconductor component, said edge termination being adjacent to the first surface region whereby a space charge region is formed in the edge termination in the presence of a voltage applied at a junction between the semiconductor body and said one semiconductor region and, a near-surface structure having at least one depression is formed in a surface region of the edge termination adjacent to the main surface, in such a way that the near-surface structure lies inside the space charge region and the near-surface structure comprises a waffle-shaped structure with a plurality of depressions.

2. The power semiconductor component according to claim 1, wherein the at least one depression is filled with a dielectric material.

3. The power semiconductor component according to claim 2, wherein a passivation layer of dielectric material is deposited on the main surface of the semiconductor body in the surface region of the edge termination.

4. The power semiconductor component according to claim 1, wherein the at least one depression comprises an annular trench and, wherein a ratio between a width and a depth of the trench is equal to or less than 1.

5. The power semiconductor component according to claim 4, wherein the trench has a depth that is smaller than 15 μm.

6. The power semiconductor component according to claim 4, wherein the trench has a width that is smaller than the depth.

7. The power semiconductor component according to claim 1, wherein a channel stopper is provided in a region of the edge termination, and the near-surface structure is arranged between the channel stopper and the first surface region.

8. The power semiconductor component according to claim 1, wherein the semiconductor component is terminated in the region of the edge termination with a zone produced by insulation diffusion, and the near-surface structure is arranged between the first surface region and the zone produced by insulation diffusion.

9. The power semiconductor component according to claim 8, wherein field-limiting rings are provided in the region of the edge termination, and the near-surface structure is arranged between the field-limiting rings and said zone.

10. The power semiconductor component according to claim 1, wherein the waffle-shaped structure comprises a pattern of pyramids.

11. The power semiconductor component according to claim 10, wherein higher doping is provided at peaks of said pyramids to avoid an inversion at said peaks.

* * * * *